(12) United States Patent
Qu et al.

(10) Patent No.: US 9,588,192 B2
(45) Date of Patent: Mar. 7, 2017

(54) MAGNETIC SENSOR CHIP AND MAGNETIC SENSOR

(76) Inventors: Bingjun Qu, Beijing (CN); Wei Xiong, Santa Clara, CA (US)

( * ) Notice: Subject to any disclaimer, the term of this patent is extended or adjusted under 35 U.S.C. 154(b) by 272 days.

(21) Appl. No.: 14/004,255

(22) PCT Filed: Jan. 21, 2012

(86) PCT No.: PCT/CN2012/000122
§ 371 (c)(1),
(2), (4) Date: Sep. 10, 2013

(87) PCT Pub. No.: WO2012/122851
PCT Pub. Date: Sep. 20, 2012

(65) Prior Publication Data
US 2014/0002074 A1    Jan. 2, 2014

(30) Foreign Application Priority Data

Mar. 11, 2011  (CN) .......................... 2011 1 0058477

(51) Int. Cl.
*B82Y 25/00* (2011.01)
*G01R 33/05* (2006.01)
(Continued)

(52) U.S. Cl.
CPC .............. *G01R 33/05* (2013.01); *B82Y 25/00* (2013.01); *G01R 33/093* (2013.01); *H01L 43/08* (2013.01)

(58) Field of Classification Search
CPC ...... B82Y 25/00; G01R 33/05; G01R 33/093; H01L 43/08
(Continued)

(56) References Cited

U.S. PATENT DOCUMENTS 4,504,540 A * 3/1985 Kaminaka et al. ......... 428/195.1
6,630,882 B1 * 10/2003 Heremans et al. ......... 338/32 H
(Continued)

FOREIGN PATENT DOCUMENTS

CN       100356605 C    12/2007
CN       100543489 C     9/2009
(Continued)

OTHER PUBLICATIONS

International Search Report dated Apr. 19, 2012 for PCT/CN2012/000122.

*Primary Examiner* — Son Le
*Assistant Examiner* — Akm Zakaria
(74) *Attorney, Agent, or Firm* — Matthew J. Lattig; Charter IP, LLC

(57) ABSTRACT

Disclosed are a magnetic sensor chip and a magnetic sensor. The magnetic sensor chip comprises a magnetic sensitive film (2, 21), and in the longitudinal direction of the magnetic sensitive film (2, 21) are provided a number n of suppression units (4) capable of achieving the sectionalized suppression of a demagnetizing field, where the number n is an integer equal to or greater than 2. By means of the suppression units (4) arranged in the longitudinal direction of the magnetic sensitive film (2, 21), the magnetic sensitive film (2, 21) to achieve a suppression of a demagnetizing field, so as to reduce or even eliminate the hysteresis of the magnetic sensitive film (2, 21), thus improving the sensitivity of the magnetic sensor chip.

14 Claims, 4 Drawing Sheets

(51) Int. Cl.
*G01R 33/09* (2006.01)
*H01L 43/08* (2006.01)

(58) Field of Classification Search
USPC ..... 324/249, 252, 258; 360/294, 313, 245.3; 257/295, 421
See application file for complete search history.

(56) References Cited

U.S. PATENT DOCUMENTS

| | | | |
|---|---|---|---|
| 7,145,331 | B2 | 12/2006 | Kuroe et al. |
| 7,589,527 | B2 | 9/2009 | Minamitani et al. |
| 7,764,158 | B2 * | 7/2010 | Kubono ................ H01F 27/34 336/200 |
| 2003/0094944 | A1 * | 5/2003 | Suzuki et al. ............. 324/252 |
| 2004/0150397 | A1 * | 8/2004 | Kuroe et al. ............. 324/249 |
| 2005/0054120 | A1 * | 3/2005 | Wakui et al. ................ 438/3 |
| 2006/0043444 | A1 * | 3/2006 | Nickel ...................... 257/295 |
| 2009/0146656 | A1 * | 6/2009 | Minamitani et al. ....... 324/252 |
| 2010/0045282 | A1 * | 2/2010 | Shibasaki et al. ......... 324/249 |
| 2010/0188782 | A1 * | 7/2010 | Yamazaki ................. 360/294 |
| 2010/0213934 | A1 * | 8/2010 | Wang et al. ............... 324/252 |
| 2012/0002330 | A1 * | 1/2012 | Matsuzawa et al. ....... 360/313 |
| 2012/0099227 | A1 * | 4/2012 | Lueng et al. ............ 360/245.3 |
| 2012/0146165 | A1 * | 6/2012 | Ausserlechner et al. .... 257/421 |
| 2012/0270073 | A1 * | 10/2012 | Covington et al. ......... 428/812 |
| 2012/0306490 | A1 * | 12/2012 | Furuichi et al. ............ 324/252 |

FOREIGN PATENT DOCUMENTS

| | | |
|---|---|---|
| CN | 101666864 A | 3/2010 |
| JP | 2003264323 A | 9/2003 |

* cited by examiner

MAGNETIC SENSOR CHIP AND MAGNETIC SENSOR

CROSS-REFERENCE TO RELATED APPLICATIONS

The present application claims priority under 35 U.S.C. §365(a) to pending PCT International Application No. PCT/CN2012/000122 to the inventors, filed Jan. 21, 2012, which in turn claims priority under 35 U.S.C. §119(a) to pending Chinese Patent Application No. 201110058477.1 to the inventors, filed Mar. 11, 2011. The entire contents of each of these applications are hereby incorporated by reference herein.

FIELD OF THE INVENTION

The present invention relates to nanometer sensor technology, and in particular, relates to a magnetic sensor chip and a magnetic sensor including such magnetic sensor chip.

BACKGROUND OF THE INVENTION

The magnetic sensor is a device for converting changes in the magnetic characteristics of the sensing elements caused by magnetic field, current, stress strain, temperature or light into electric signal, so as to measure related physical quantities, particularly minute physical quantity. Compared to conventional sensors, the magnetic sensor has the advantages such as high sensitivity, and is therefore widely used in navigation, spaceflight, geological prospecting, medical imaging, information collection and military applications.

With the development of technology, the magnetic sensor chip becomes the core component of the magnetic sensor for the advantages such as low power consumption, small size, high sensitivity, integratable attribution, low costs, fast response, high resolution, good stability and high reliability. The utilization of the magnetic sensor chip spreads the applications of the magnetic sensor in magnetic information storage, automation and the Internet of Things.

FIG. 1 depicts the structure of a conventional magnetic sensor chip. As shown in FIG. 1, the magnetic sensor chip comprises a magnetic sensitive film 2 and a conductor 3, the conductor 3 is provided at two ends of the magnetic sensitive film 2 for connecting to other components. During the operation of such magnetic sensor chip, the demagnetizing field of the magnetic sensitive film 2 may be large because of the large ratio between the length and width thereof. Therefore, the magnetic sensor chip suffers severe hysteresis. FIG. 2 shows a curve of the hysteresis loop of the conventional magnetic sensor chip, wherein the lateral axis represents the intensity (H) of the applied magnetic field, and the vertical axis represents the resistance (R) of the magnetic sensor chip. As shown in FIG. 2, the hysteresis loop of the magnetic sensor chip has a large width, i.e. the magnetic sensor chip has large hysteresis, which reduced the sensitivity of the magnetic sensor chip.

SUMMARY OF THE INVENTION

Regarding the above defects exist in the magnetic sensor chip, an object of the present invention is to provide a magnetic sensor chip which can reduce or even eliminate the hysteresis so as to improve the sensitivity of the magnetic sensor chip.

In order to solve the above problems, the present invention further provides a magnetic sensor with high sensitivity.

The present invention provides a magnetic sensor chip comprising a magnetic sensitive film, wherein a number n of suppression units capable of achieving the sectionalized suppression of a demagnetizing field are arranged with intervals in the longitudinal direction of the magnetic sensitive film, wherein n is an integer equal to or larger than 2.

Preferably, the suppression units are notches, by means of which the magnetic sensitive film is divided into n+1 sections of short magnetic sensitive film; said notches run through the thickness and width directions of the magnetic sensitive film, and each notch has an electric connector at position thereof for electrically connecting two neighboring short magnetic sensitive films; alternatively, said notches completely run through the thickness direction of the magnetic sensitive film, while partly run through the width direction thereof; alternatively, said notches partly run through the thickness direction of the magnetic sensitive film, while completely run through the width direction thereof; alternatively, said notches partly run through both the thickness and the width direction of the magnetic sensitive film.

Preferably, the projections of the notches on the horizontal plane have a shape of rectangle, circle, oval, dumbbell, spindle, drum, parallelogram, triangle or polygon.

Preferably, said notches are filled with insulating material or conductive material.

Preferably, said suppression units are suppression conductors made of conductive material, said suppression conductors are disposed at the upper and/or lower surface and/or internal and/or external side of the magnetic sensitive film, and are connected with the power source positioned outside the magnetic sensitive film.

Preferably, there is an insulator disposed between the suppression conductor and the magnetic sensitive film, the insulator is covered by the suppression conductor, such that the surface of the insulator not contacting the magnetic sensitive film is packed; alternatively, there is an insulator disposed on the surface of the suppression conductor not contacting the magnetic sensitive film, said suppression conductor is covered by the insulator, such that the surface of the suppression conductor not contacting the magnetic sensitive film is packed.

Preferably, the suppression units are heaters disposed at the upper and/or lower surface and/or internal/external side of the magnetic sensitive film.

Preferably, there is a heat insulator disposed at the outside of the heater and covered said heater, such that the heat from the heater can be concentrated onto the magnetic sensitive film.

Preferably, the suppression units are hard magnets which are disposed at the internal and/or external side and/or upper and/or lower surface of the magnetic sensitive film.

Preferably, the hard magnet is closely adjacent to said magnetic sensitive film or separated from the magnetic sensitive film with an interval.

Preferably, the suppression units are doping sections within the magnetic sensitive film, by means of which the magnetic sensitive film is divided into n+1 sections of short magnetic sensitive film; said doping sections run through the thickness and width directions of the magnetic sensitive film; alternatively, said doping sections completely run through the thickness direction of the magnetic sensitive film, while partly run through the width direction thereof; alternatively, said doping sections partly run through the thickness direction of the magnetic sensitive film, while completely run through the width direction thereof; alternatively, said doping sections partly run through both the thickness and the width direction of the magnetic sensitive film.

Preferably, the dopant in the doping sections is Carbon, Nitrogen, Oxygen, Boron, Helium, Phosphorus, Aluminum, Zinc or Tin.

Preferably, the magnetic sensitive film is an anisotropic magneto-resistance film, giant magneto-resistance film or tunneling magneto-resistance film.

Preferably, a protective film is provided on the surface of the magnetic sensor chip, and the protective film is a silicon dioxide film, alumina film, silicon nitride film, ceramic film, polyimide film or epoxy resin film.

The present invention also provides a magnetic sensor comprising the magnetic sensor chip according to the present invention.

The present invention has the following advantages:

The magnetic sensitive film of the present invention makes the magnetic sensitive film 2 capable of achieving the sectionalized suppression of a demagnetizing field by using the suppression units disposed along the longitude direction of the magnetic sensitive film 2, so as to reduce or even eliminate the hysteresis of the magnetic sensitive film 2, thus improve the sensitivity of the magnetic sensor chip.

Furthermore, the present invention also provides a magnetic sensor comprising the magnetic sensor chip according to the invention, by means of which the sensitivity of the magnetic sensor can be improved. Compared with the magnetic sensor adopting conventional magnetic sensor chip, in the same operation conditions, the magnetic sensor according to the present invention provides a doubled output voltage (up to 600 mV), and the sensitivity is increased by 3 dB.

DETAILED DESCRIPTION OF THE PREFERRED EMBODIMENTS

Figure 1:
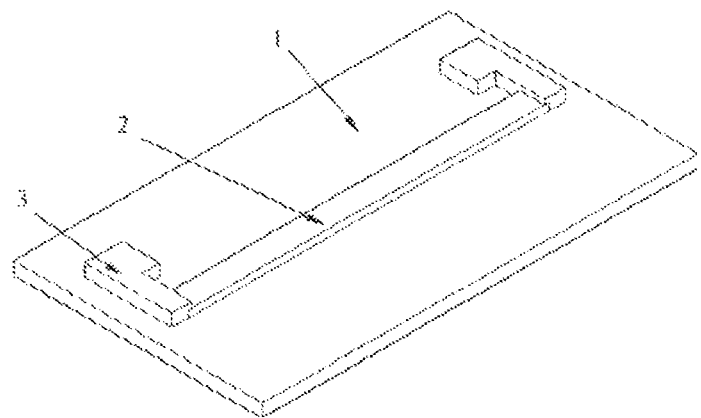
FIG. 1 is a diagram showing the structure of a conventional magnetic sensor chip.
Figure 2:
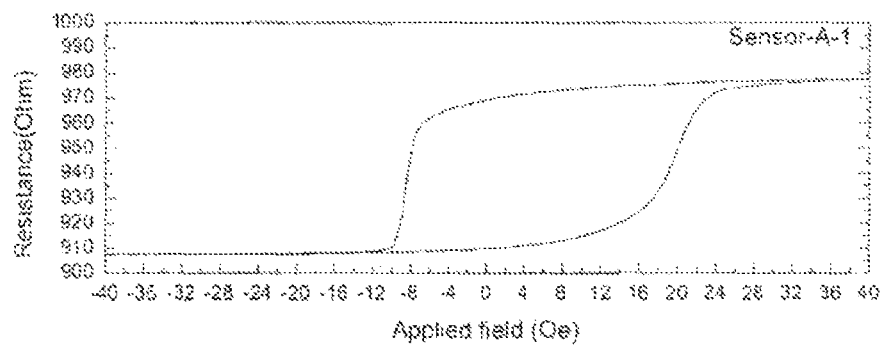
FIG. 2 is a curve of the hysteresis loop of the conventional magnetic sensor chip.

In order to make the solutions of the present invention more apparent to persons skilled in the art, the magnetic sensor chip of the present invention and the fabricating method thereof will be described in detail below taken in conjunction with the figures.

The magnetic sensor chip provided in the present invention comprises a substrate 1, a magnetic sensitive film 2 and a conductor 3. The conductor 3 is provided at two ends of the magnetic sensitive film 2 for electrically connecting to other components (such as the conductive circuit) provided outside the magnetic sensitive film 2. A number n of suppression units capable of achieving the sectionalized suppression of a demagnetizing field are arranged with intervals in the longitudinal direction of the magnetic sensitive film 2, wherein n is an integer equal to or larger than 2.

The magnetic sensitive film 2 may be an anisotropic magneto-resistance film, giant magneto-resistance film or tunneling magneto-resistance film. The suppression unit may be a notch, a suppression conductor, a heater, a hard magnet or a doping section.

A protective film may be provided on the surface of the magnetic sensor chip (excluding the conductor 3) to prevent the magnetic sensitive film 2 and/or the electrical connections from corrosion, oxidation or short-circuit. The protective film may be a silicon dioxide film, alumina film, silicon nitride film, ceramic film, polyimide film or epoxy resin film.

The substrate 1 may be a silicon wafer subjected to oxidation, or other materials such as glass that may be used as sensor substrate.

It should be noted that, the "upper surface" of the magnetic sensitive film used herein refers to the surface of the magnetic sensitive film facing upward when the substrate is placed horizontally. Correspondingly, the surface of the magnetic sensitive film facing downward is referred to as "the lower surface". The internal side is the side of the magnetic sensitive film where the conductors 3 project, and the opposite side is the external side.

The First Embodiment

Figure 3:
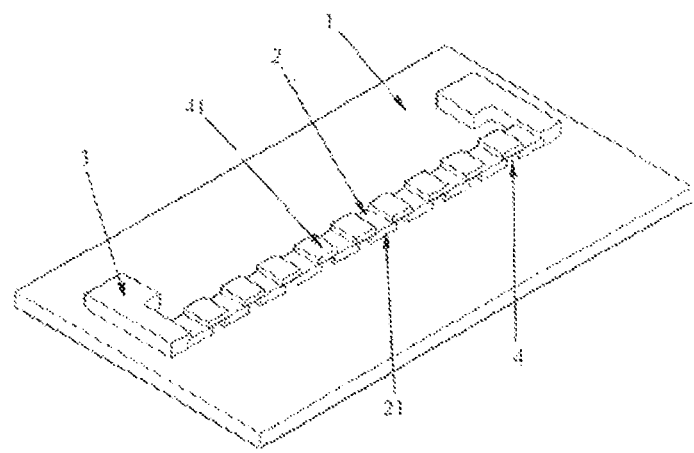
FIG. 3 is a partial structure diagram of a magnetic sensor chip according to the first embodiment of the present invention.

FIG. 3 is a structure diagram of a magnetic sensor chip according to the first embodiment of the present invention. With reference to FIG. 3, the magnetic sensor chip comprises a substrate 1, the magnetic sensitive film 2, the conductor 3 and a protective film (not shown in the figure). The conductor 3 is disposed at two ends of the magnetic sensor chip 2 for electrically connecting with other components outside the magnetic sensor chip 2. The suppression units are notches 4, each notch runs through the thickness and width directions of the magnetic sensitive film 2, and there is an electric connector 41 inside each notch for electrically connecting two neighboring short magnetic sensitive films 21. The magnetic sensitive film 2 is divided into n+1 sections of short magnetic sensitive films 21 by means of the notches 4. Since the ratio of the length to width of the projections of the short magnetic sensitive films 21 on the horizontal plane are relatively small, the hysteresis phenomenon of the magnetic sensor chip can be reduced, thus the sensitivity of the magnetic sensor chip is improved. The electric connector 41 is made of conductive material. As shown in FIG. 3, the electric connector 41 may fully fill the notch 4, or fill only a part of the notch 4 or the upper surface region of the notch 4 close to the short magnetic sensitive films 21. For example, air gaps may be formed within the notches 4 by filling only the upper surface region of the notches 4 close to the short magnetic sensitive films 21. Obviously, the electric connector 41 may fill only the lower surface region, internal or external regions of the notches 4 close to the short magnetic sensitive films 21.

The projection of the notch 4 on the horizontal plane may have a shape of rectangle, circle, oval, dumbbell, spindle, drum, parallelogram, triangle or polygon.

It should be noted that, the notches 4 may partly run through the thickness and/or width directions of the magnetic sensitive film 2, i.e. completely run through the thickness direction of the magnetic sensitive film 2, while partly run through the width direction thereof; alternatively, said notches partly run through the thickness direction of the magnetic sensitive film 2, while completely run through the width direction thereof; alternatively, said notches partly run through both the thickness and the width direction of the magnetic sensitive film 2. If the notches 4 only partly run through the thickness and/or the width direction of the magnetic sensitive film 2, the magnetic sensitive film 2 remains electrically connecting, thus it is not necessary to fill the notch 4 with conductive materials. However, the notches 4 may also be filled with conductive materials even if the notches 4 partly run through the thickness and/or the width direction of the magnetic sensitive film 2, thus may also achieve the object of the present invention. In other words, the object of the present invention can be achieved by filling the notches 4 with insulating or conductive materials or not filling anything.

Figure 4:
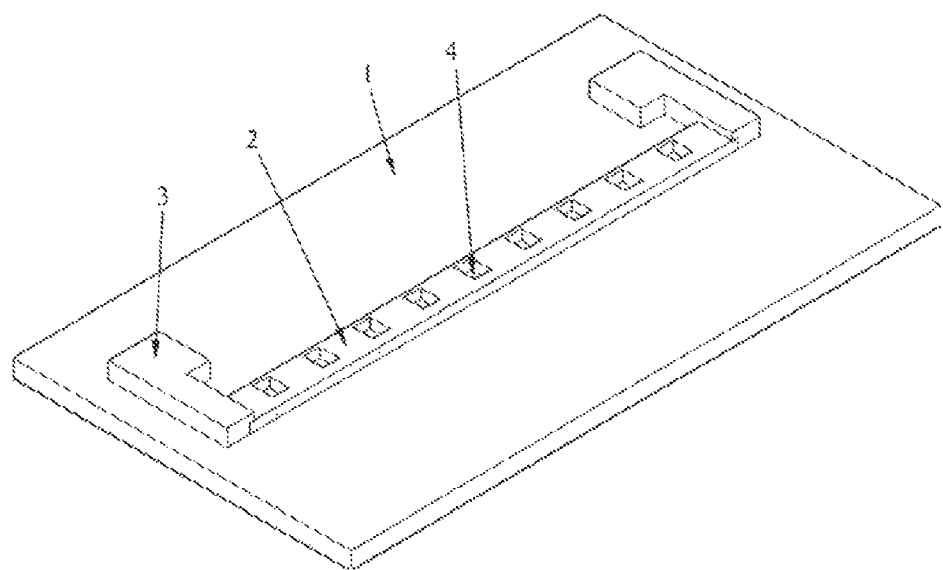
FIG. 4 is a structure diagram where the notches run through the width direction of the magnetic sensitive film.

FIG. 4 is a structure diagram where the notches run through the width direction of the magnetic sensitive film 2. As shown in FIG. 4, the notches 4 is arranged at the center in the width direction of the magnetic sensitive film 2.

According to the present embodiment, the magnetic sensitivity effect of the portion of the magnetic sensitive film 2 located at the notches can be suppressed by means of the notches, so as to achieve the sectionalized suppression of the demagnetizing field of the magnetic sensitive film 2, such that the hysteresis phenomenon of the magnetic sensitive film 2 can be reduced or even eliminated and the sensitivity of the magnetic sensor chip can be improved.

The Second Embodiment

Figure 5:
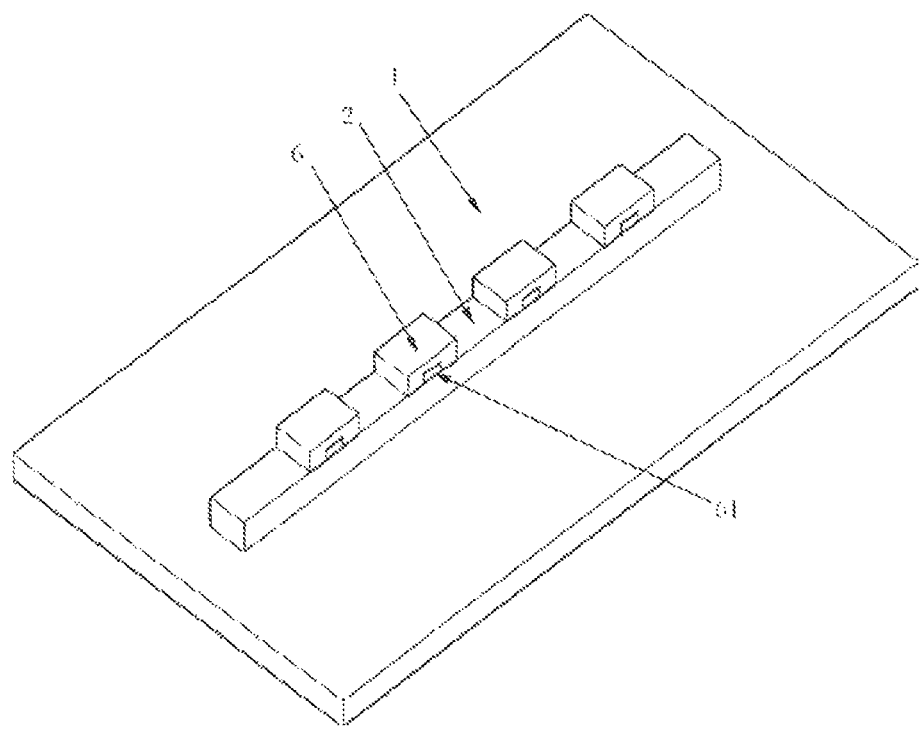
FIG. 5 is a structure diagram of a magnetic sensor chip according to the second embodiment of the present invention.

FIG. 5 is a structure diagram of a magnetic sensor chip according to the second embodiment of the present invention (the conductor 3 for electrical connection at two ends of the chip is not shown). With reference to FIG. 5, the suppression units are the suppression conductors 6 made of conductive materials. The suppression conductors 6 are disposed on the upper surface of the magnetic sensitive film 2, and are connected with the power source positioned outside the magnetic sensitive film. The suppression conductors 6 may run through the width of the magnetic sensitive film completely, or run through only a part of the width of the magnetic sensitive film. Of course, the suppression conductors 6 may be disposed at the lower surface and/or internal and/or external side of the magnetic sensitive film 2. When the suppression conductors 6 are connected to the power source, i.e. a current flowing through the suppression conductors 6, the magnetic sensitivity effect of the portions of the magnetic sensitive film opposed to the suppression conductors 6 can be suppressed, so as to achieve the sectionalized suppression of the demagnetizing field of the magnetic sensitive film 2, such that the hysteresis phenomenon of the magnetic sensitive film 2 can be reduced or even eliminated and the sensitivity of the magnetic sensor chip can be improved.

Insulators 61 may be further provided between the suppression conductors 6 and the magnetic sensor chip 2. That is, the insulators 61 are provided on the surface of the magnetic sensitive film 2 and are covered by the suppression conductors 6, i.e. the insulators 61 are sandwiched between the suppression conductors 6 and the magnetic sensor chip 2, respectively. Alternatively, the insulators 61 may be provided on the surfaces of the suppression conductors 6, the suppression conductors 6 are covered by the insulators 61, such that the suppression conductors 6 are sandwiched between the insulators 61 and the magnetic sensor chip 2, respectively.

When the suppression conductors 6 are provided on the lower surface of the magnetic sensor chip 2, in order to fabricate the magnetic sensor chip 2, the concave regions between neighboring suppression conductors 6 need to be flattened using filling stuff, such that a flat surface for fabricating the magnetic sensor chip 2 can be obtained.

The Third Embodiment

Figure 6:
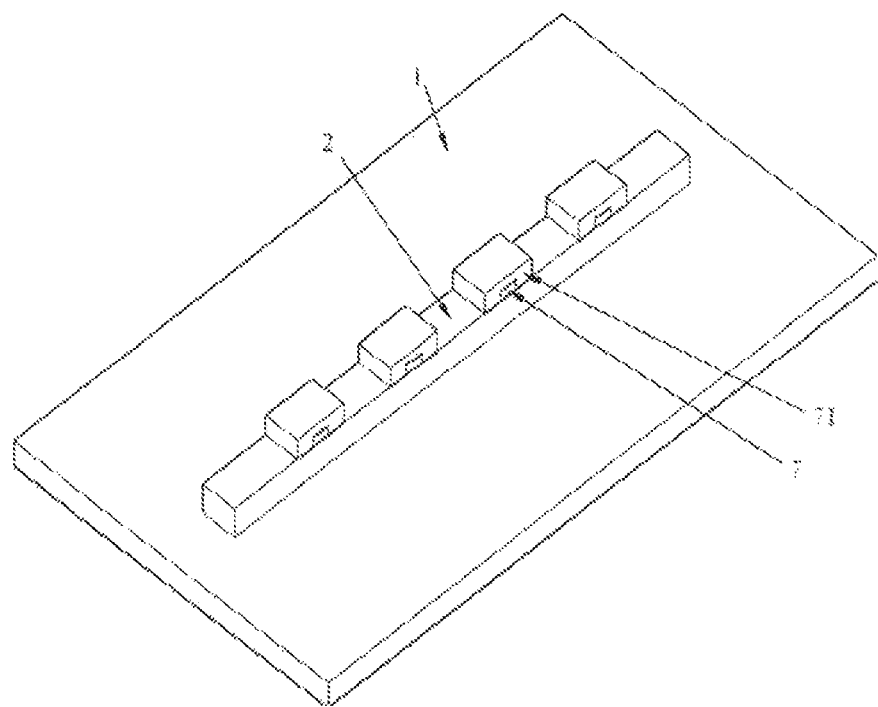
FIG. 6 is a structure diagram of a magnetic sensor chip according to the third embodiment of the present invention.

FIG. 6 is a structure diagram of a magnetic sensor chip according to the third embodiment of the present invention (the conductor 3 for electrical connection at two ends of the chip is not shown). With reference to FIG. 6, the suppression units are heaters 7 disposed on the upper surface of the magnetic sensor chip 2. Of course, the heaters 7 may be disposed on the lower surface and/or internal and/or external side of the magnetic sensitive film 2. The magnetic sensitivity effect of the portions of the magnetic sensitive film opposed to the heaters 7 can be suppressed, so as to achieve the sectionalized suppression of the demagnetizing field of the magnetic sensitive film 2, such that the hysteresis phenomenon of the magnetic sensitive film 2 can be reduced or even eliminated and the sensitivity of the magnetic sensor chip can be improved.

A heat insulator 71 may be provided at the outside of a heater 7 and covers the heater 7, i.e. the heater 7 is sandwiched between the heat insulator 71 and the magnetic sensitive film 2. By means of the heat insulator 71, the heat generated from the heater 7 can be concentrated onto the magnetic sensitive film 2, such that the suppression effect against the magnetic sensitive effect of the portion of the magnetic sensitive film opposed to the heater can be enhanced, while the heat loss can be reduced.

When the heaters 7 are provided below the lower surface of the magnetic sensor chip 2, in order to fabricate the magnetic sensor chip 2, the concave regions between neighboring heaters 7 need to be flattened using filling stuff, such that a flat surface for fabricating the magnetic sensor chip 2 can be obtained.

The Fourth Embodiment

Figure 7:
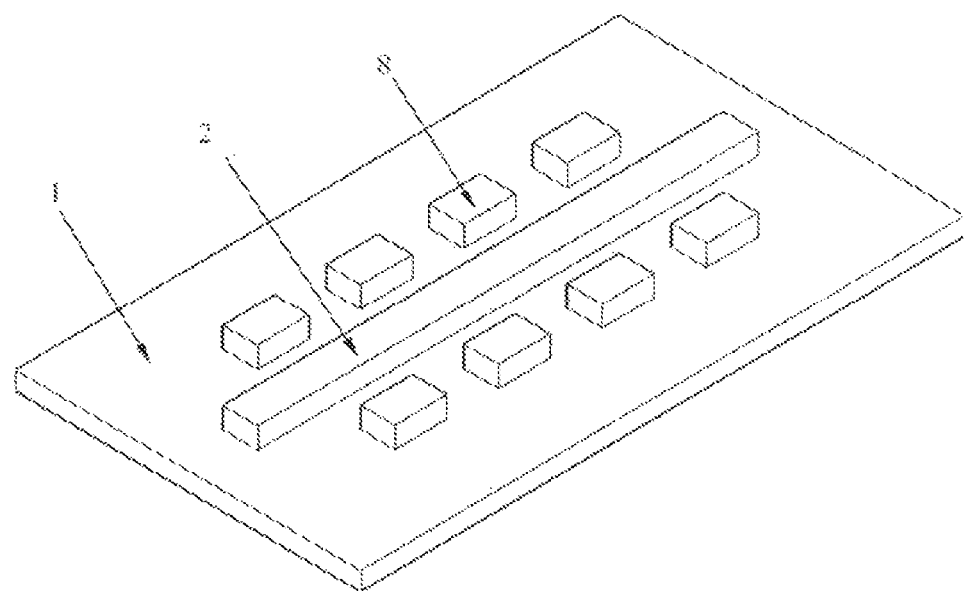
FIG. 7 is a structure diagram of a magnetic sensor chip according to the fourth embodiment of the present invention.

FIG. 7 is a structure diagram of a magnetic sensor chip according to the fourth embodiment of the present invention (the conductor 3 for electrical connection at two ends of the chip is not shown). With reference to FIG. 7, the suppression units are hard magnets 8 disposed inside and outside the magnetic sensor chip 2. Alternatively, the hard magnets 8 may be provided at the internal or external side of the magnetic sensor chip 2, or at the upper surface and/or lower surface of said magnetic sensor chip. The hard magnets 8 may closely adjacent to said magnetic sensitive film 2 or separated from the magnetic sensitive film 2 with a certain interval. The magnetic sensitivity effect of the portions of the magnetic sensitive film opposed to the hard magnets 8 can be suppressed by the hard magnets 8, so as to achieve the sectionalized suppression of the demagnetizing field of the magnetic sensitive film 2, such that the hysteresis phenomenon of the magnetic sensitive film 2 can be reduced or even eliminated and the sensitivity of the magnetic sensor chip can be improved.

When the hard magnets 8 are provided below the lower surface of the magnetic sensor chip 2, in order to fabricate the magnetic sensor chip 2, the concave regions between neighboring hard magnets 8 need to be flattened using filling stuff, such that a flat surface for fabricating the magnetic sensor chip 2 can be obtained.

The Fifth Embodiment

Figure 8:
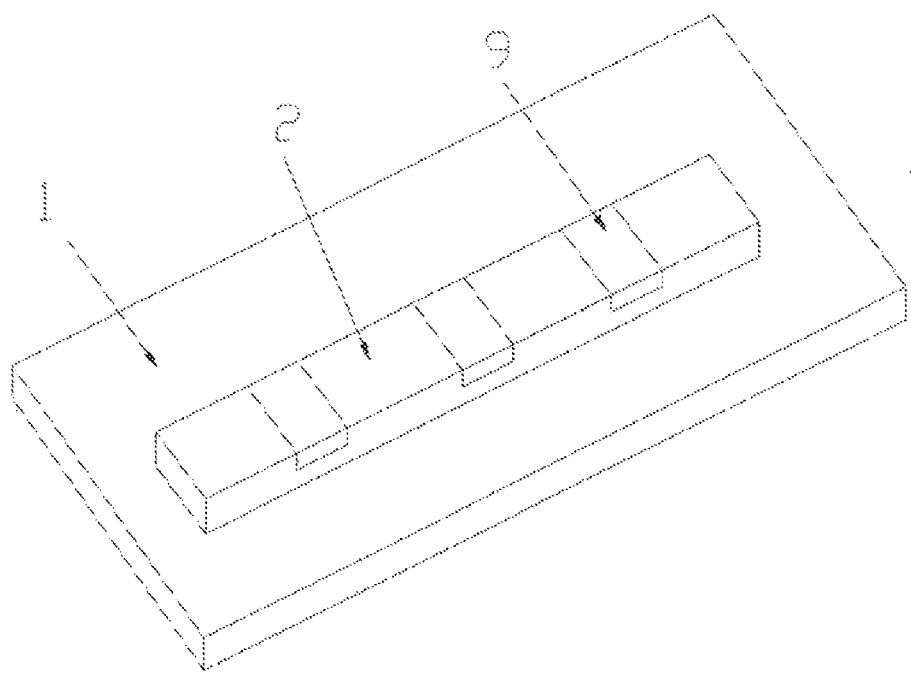
FIG. 8 is a structure diagram of a magnetic sensor chip according to the fifth embodiment of the present invention.

FIG. 8 is a structure diagram of a magnetic sensor chip according to the fifth embodiment of the present invention (the conductor 3 for electrical connection at two ends of the chip is not shown). With reference to FIG. 8, the suppression units are doping sections 9 provided within the magnetic sensitive film 2. Said doping sections run through the thickness and width directions of the magnetic sensitive film 2; alternatively, said doping sections completely run through the thickness direction of the magnetic sensitive film 2, while partly run through the width direction thereof; alternatively, said doping section partly run through the thickness direction of the magnetic sensitive film 2, while completely run through the width direction thereof; alternatively, said doping section partly run through both the thickness and the width directions of the magnetic sensitive film 2.

Preferably, the dopant in the doping sections is Carbon, Nitrogen, Oxygen, Boron, Helium, Phosphorus, Aluminum, Zinc or Tin. The doping method may be thermal diffusion, ion implantation, plasma doping, projected gas immersion laser doping, vapor doping, ion shower doping, metal ion doping or anion doping.

Figure 9:
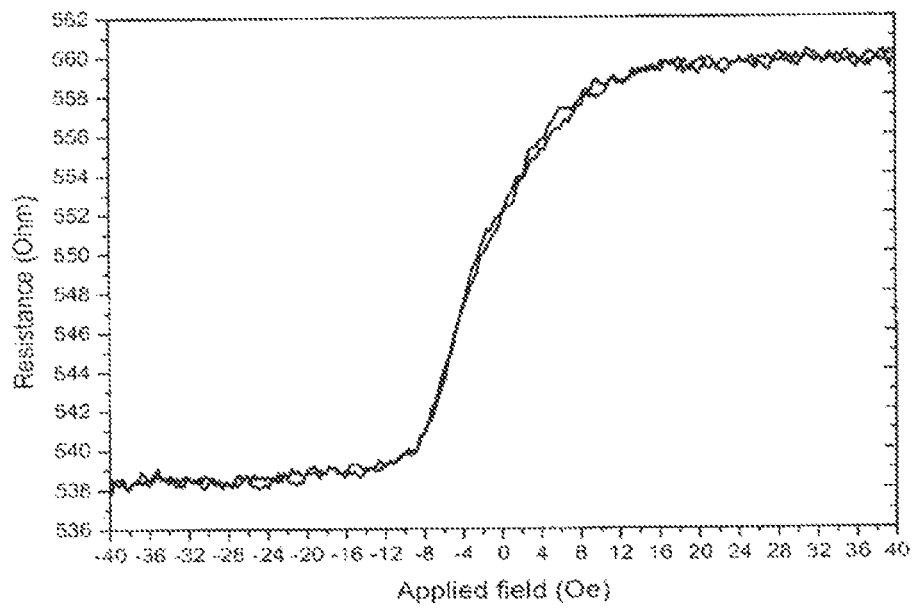
FIG. 9 is a curve of the hysteresis loop of the magnetic sensor chip according to the first embodiment of the present invention.

FIG. 9 is a curve of the hysteresis loop of the magnetic sensor chip according to the first embodiment of the present invention. In the figure, the lateral axis represents the intensity (H) of the applied magnetic field, and the vertical axis represents the magnetization intensity (M). With reference to FIG. 9, the hysteresis loop of the magnetic sensor chip is substantially coincident, which means the coercive force of the magnetic sensor chip is close to zero. Therefore, the magnetic sensor chip according to the first embodiment has high sensitivity. The curves of the hysteresis loop of the magnetic sensor chips according to the second to fifth embodiments are substantially same to that in FIG. 9.

By means of the suppression units disposed along the longitude direction of the magnetic sensitive film 2, the magnetic sensor chip of the present invention makes the magnetic sensitive film 2 capable of achieving the sectionalized suppression of a demagnetizing field, so as to reduce or even eliminate the hysteresis of the magnetic sensitive film 2, thus improve the sensitivity of the magnetic sensor chip.

Furthermore, the present invention provides a magnetic sensor comprising the magnetic sensor chip according to the first to fifth embodiments, by means of which the sensitivity of the magnetic sensor can be improved. As compared with the magnetic sensor adopting conventional magnetic sensor chip, at the same operation conditions, the magnetic sensor according to the present invention provides a doubled output voltage (up to 600 mV), and the sensitivity is increased by 3 dB.

It shall be understood that, above embodiments are only illustrations for explaining the principle of the present invention. The present invention is not limited thereto. Various modifications and improvements are apparent to persons skilled in the art without departing from the spirit and contents of the present invention, and these modifications and improvements will fall within the scope of the technical solutions of the present invention.

What is claimed is:

1. A magnetic sensor chip comprising:
   a magnetic sensitive film, the magnetic sensitive film being continuous and including a thickness direction and a width direction, and a number n of suppression units configured to achieve a sectionalized suppression of a demagnetizing field, the suppression units arranged in adjacent spaced relation on the magnetic sensitive film along a longitudinal direction of the magnetic sensitive film, wherein
   n is an integer equal to or larger than 2
   the suppression units are embodied as notches, by means of which the magnetic sensitive film is divided into n+1 sections of the magnetic sensitive film;
   said notches being adapted to completely run through the thickness direction of the magnetic sensitive film, while being adapted to partly run through the width direction thereof; or
   said notches being adapted to partly run through the thickness direction of the magnetic sensitive film, while being adapted to completely run through the width direction thereof; or
   said notches being adapted to partly run through both the thickness and the width directions of the magnetic sensitive film.

2. The magnetic sensor chip according to claim 1, wherein projections of the notches in the horizontal plane have at least one of a shape of a rectangle, circle, oval, dumbbell, spindle, drum, parallelogram, triangle or polygon.

3. The magnetic sensor chip according to claim 1, wherein said notches are filled with insulating material or conductive material.

4. The magnetic sensor chip according to claim 1, wherein said suppression units are embodied as suppression conductors made of conductive material, said suppression conductors being disposed on at least one or more of the upper surface, lower surface, internal side and external side of the magnetic sensitive film, and connected to a power source positioned outside the magnetic sensitive film.

5. The magnetic sensor chip according to claim 4, further comprising an insulator disposed between the suppression conductor and the magnetic sensitive film and covered by the suppression conductor so that a portion of the surface of the insulator not contacting the magnetic sensitive film is packed; or the insulator is disposed on a portion of the surface of the suppression conductor not contacting the magnetic sensitive film so as to cover the suppression conductor so that the surface of the suppression conductor not contacting the magnetic sensitive film is packed.

6. The magnetic sensor chip according to claim 1, wherein the suppression units are embodied as heaters disposed on at least one or more of the upper surface, lower surface, internal side and external side of the magnetic sensitive film.

7. The magnetic sensor chip according to claim 6, further comprising a heat insulator disposed at the outside of the heater so as to cover said heater so that the heat generated from the heater is able to be concentrated onto the magnetic sensitive film.

8. The magnetic sensor chip according to claim 1, wherein the suppression units are embodied as hard magnets disposed on at least one or more of the internal side, external side, upper surface and lower surface of the magnetic sensitive film.

9. The magnetic sensor chip according to claim 8, wherein the hard magnets are adjacent to said magnetic sensitive film or separated from the magnetic sensitive film by an interval.

10. The magnetic sensor chip according to claim 1, wherein the magnetic sensitive film includes a thickness direction and a width direction, and wherein the suppression units are embodied as doping sections disposed within the magnetic sensitive film, by means of which the magnetic sensitive film is divided into n+1 sections thereof;

said doping sections being adapted to run through the thickness and width directions of the magnetic sensitive film; or said doping sections being adapted to completely run through the thickness direction of the magnetic sensitive film, while being adapted to partly run through the width direction thereof; or said doping sections being adapted to partly run through the thickness direction of the magnetic sensitive film, while being adapted to completely run through the width direction thereof; or said doping sections being adapted to partly run through both the thickness and the width directions of the magnetic sensitive film.

11. The magnetic sensor chip according to claim 10, wherein the dopant in the doping sections is at least one of Carbon, Nitrogen, Oxygen, Boron, Helium, Phosphorus, Aluminum, Zinc or Tin.

12. The magnetic sensor chip according to claim 1, wherein the magnetic sensitive film is at least one of an anisotropic magneto-resistance film, giant magneto-resistance film or tunneling magneto-resistance film.

13. The magnetic sensor chip according to claim 1, further comprising a protective film on a surface of the magnetic sensor chip, said protective film being at least one of a silicon dioxide film, alumina film, silicon nitride film, ceramic film, polyimide film or epoxy resin film.

14. A magnetic sensor comprising the magnetic sensor chip according to claim 1.

* * * * *